United States Patent [19]

Nishizawa et al.

[11] 4,454,526
[45] Jun. 12, 1984

[54] SEMICONDUCTOR IMAGE SENSOR AND THE METHOD OF OPERATING THE SAME

[75] Inventors: Jun-ichi Nishizawa; Tadahiro Ohmi; Takashige Tamamushi, all of Sendai, Japan

[73] Assignee: Semiconductor Research Foundation, Japan

[21] Appl. No.: 265,383

[22] Filed: May 20, 1981

[30] Foreign Application Priority Data

May 24, 1980 [JP] Japan .................................. 55-69257

[51] Int. Cl.³ .................... H01L 27/14; H01L 29/80; H01L 29/78
[52] U.S. Cl. ...................................... 357/30; 357/22; 357/23; 357/24; 357/31
[58] Field of Search ................. 357/22 E, 22 V, 22 S, 357/22 LR, 24 LA, 30 I, 30 K, 38 T, 38 LA, 38 R, 31, 23 VD; 307/238.8

[56] References Cited

U.S. PATENT DOCUMENTS

| | | | |
|---|---|---|---|
| 4,116,717 | 9/1978 | Rahilly | 357/90 X |
| 4,236,829 | 12/1980 | Chikamura et al. | 357/30 X |
| 4,250,516 | 2/1981 | Worlock | 357/16 X |
| 4,284,997 | 8/1981 | Nishizawa | 357/23 R |
| 4,365,262 | 12/1982 | Nishizawa | 357/30 X |
| 4,377,817 | 3/1983 | Nishizawa et al. | 357/30 X |

FOREIGN PATENT DOCUMENTS 55-124259 9/1980 Japan .................................. 357/30 X

*Primary Examiner*—Martin H. Edlow
*Assistant Examiner*—J. L. Badgett
*Attorney, Agent, or Firm*—McGlew and Tuttle

[57] ABSTRACT

A semiconductor image sensor of wide dynamic range, high sensitivity, low noise and high image clarity, which is provided with a hook structure for detecting radiant energy input information, a readout transistor and means for refreshing stored optical information and which is capable of non-destructive readout of optical information, and a method of operating such a semiconductor image sensor. The impurity concentrations in the hook structure, their distribution profiles, materials of layers forming the hook structure and their thicknesses are so selected as to optimize the carrier storage function of the hook structure, thereby permitting the non-destructive readout of the optical information. The ratio between the junction capacitance and the earth capacitance of a floating pn junction establishing a potential barrier in the hook structure is selected so that a stored voltage in the floating pn junction and the readout sensitivity may become maximum. By repeating the non-destructive readout, as integrated value of the quantity of incident light is read out. The time interval to a first operation of the readout transistor after the operation of a refresh pulse signal is selected in accordance with the quantity of the incident light, by which an electric signal proportional to the quantity of the incident light can be read out. The refresh operation is performed by applying a pulse voltage in such a manner that a bias voltage may be provided to a substrate electrode or surface electrode in a light integration period alone and, in the refresh period, the pulse voltage is made zero or negative.

20 Claims, 16 Drawing Figures

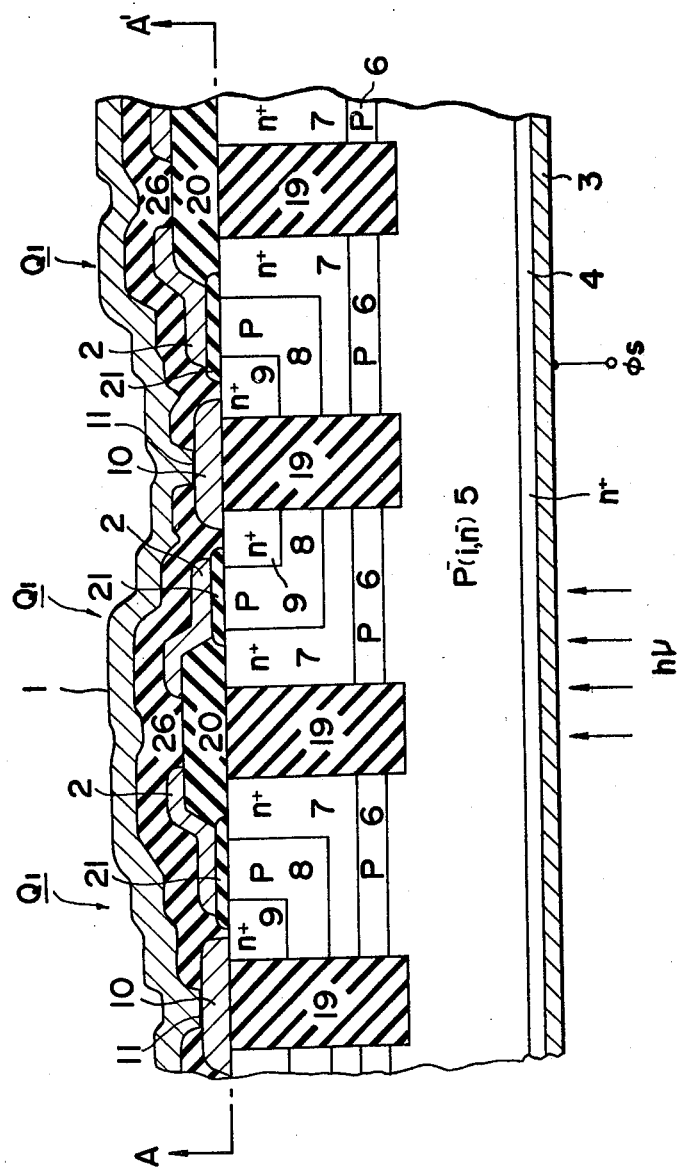

FIG. IB
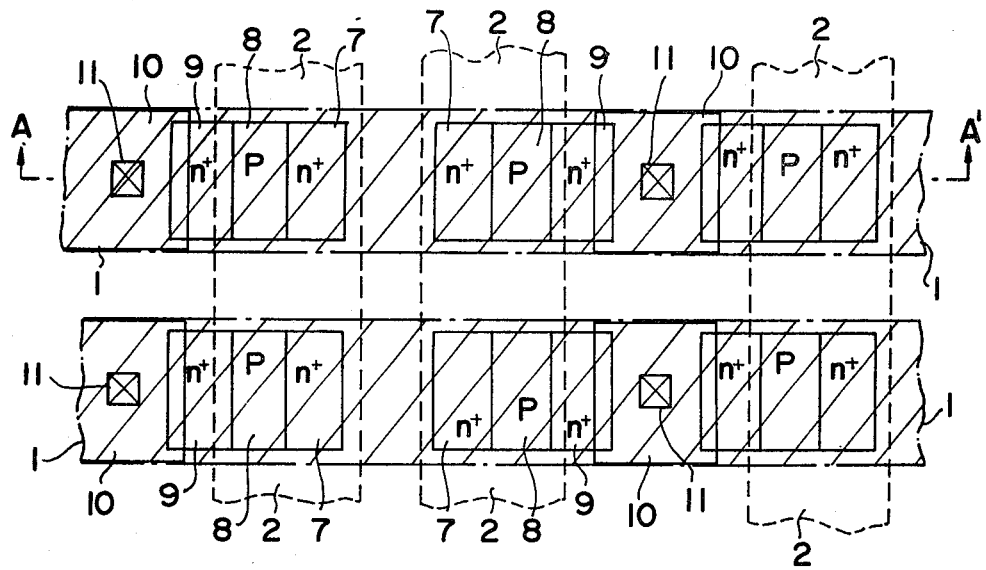
FIG. IC
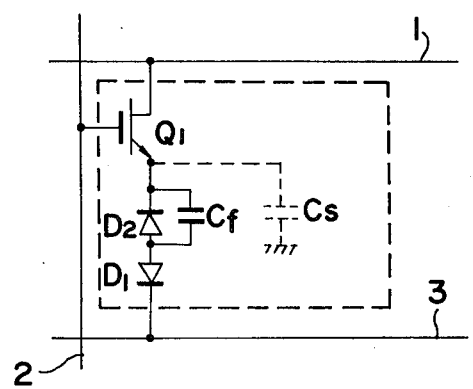

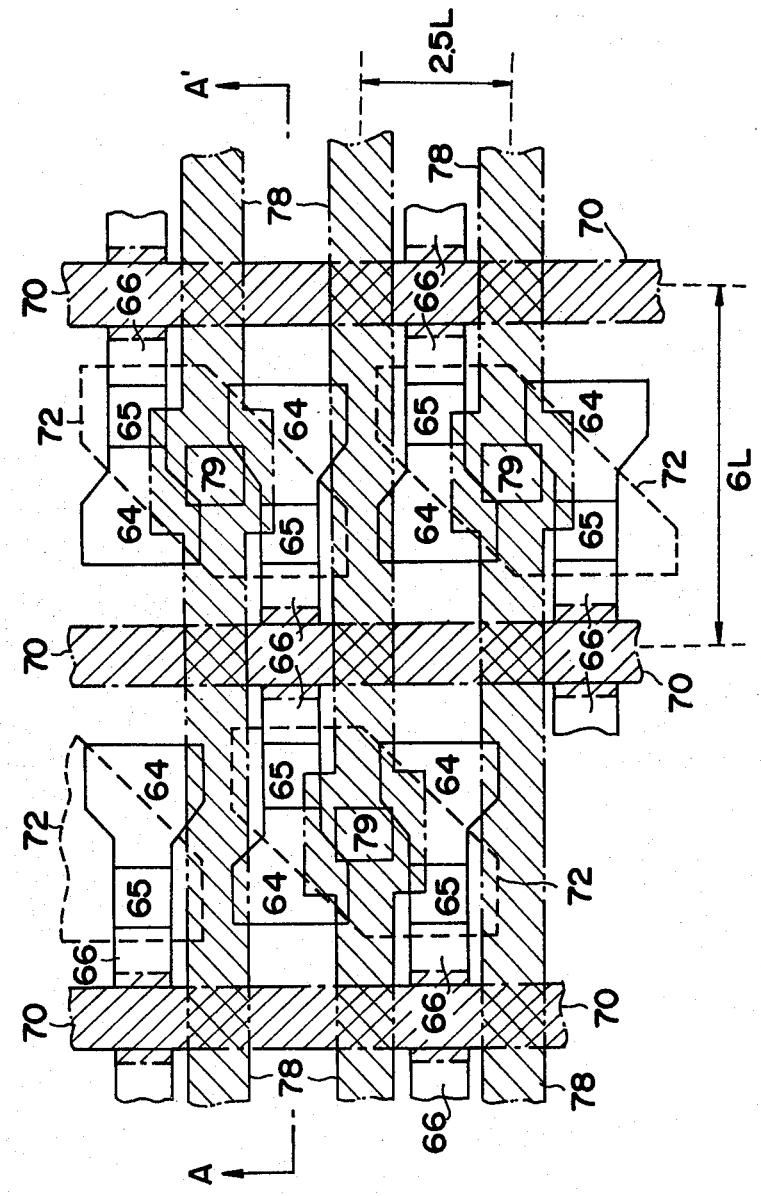

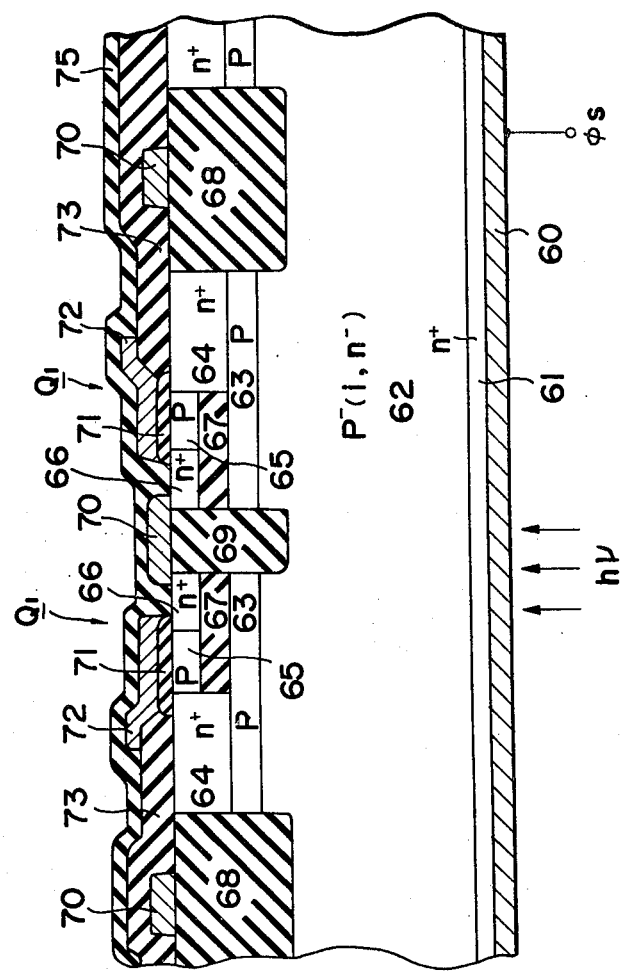

SEMICONDUCTOR IMAGE SENSOR AND THE METHOD OF OPERATING THE SAME

BACKGROUND OF THE INVENTION

1. Cross-Reference to Related Application

This patent application is related to U.S. patent application Ser. No. 06/130,775 filed Mar. 17, 1980 and now U.S. Pat. No. 4,377,817.

2. Field of the Invention

The present invention relates generally to a solid state image sensor, and more particularly to a semiconductor image sensor which is capable of non-destructive readout of optical information, wide in dynamic range, high in sensitivity, low in noise, excellent in spatial and time-domain resolution and very high in packing density. Further, the invention pertains to a method for operating such a semiconductor image sensor.

3. Description of the Prior Art

Solid-state image sensors are roughly divided into the CCD and the MOS type. Despite the similarities in fabrication technologies, the performance of the MOS and CCD image sensors are different because they have different methods of imaging the light and different techniques of reading out signal charges. In the CCD image sensor, signal charges are stored in a potential well induced by an electric field in a semiconductor region beneath an MOS capacitor electrode, and their readout is accomplished by multiple transfers through such field-induced potential wells to an output circuitry. But in the MOS image sensor, the signal charge is collected by a photodiode formed by diffusion or ion implantation, and the readout is carried out by a single transfer from the photodiode via an adjoining MOS-FET to video-out circuitry. These differences in structure, manufacture and readout result in wide differences in performance at high and low light levels and in image clarity. At low light levels, the minimum light that can be resolved by the image sensor largely depends on the light collecting ability of the image sensor, that is, the efficiency with which the image sensor can collect the light incident thereon, as well as noise introduced by the sensor cell and its associated circuitry.

The MOS image sensor converts light to signals more efficiently than the CCD. This results from the differences in the amount of light reflected from the imaging surface of each device and in the aperture efficiency. The CCD image sensor has an array of two- or three-layer electrodes on the imaging surface, which absorb much light, so that the CCD image sensor collects less light than does the MOS image sensor.

Two common techniques are used to illuminate the semiconductor substrate in monolithic image sensors. These are front and back illumination.

Either technique could be used with either CCD or MOS image sensors but front illumination is not suitable for use with the CCDs because most CCD structures have opaque electrodes on the front which reduce the light collecting area.

Unfortunately, back lighting introduces a fabrication problem and performance limitations. In the case of the back illumination, the substrate must be made very thin so that light-generated carriers (which are usually generated within about 5 $\mu$m of the semiconductor surface for visible light in the case of a silicon substrate) may be efficiently collected and stored in a depletion layer beneath capacitor electrodes on the front side. The thinnest substrate that can be fabricated has a thickness of about 25 $\mu$m. This means that device elements cannot be spaced less than 25 $\mu$m apart; namely, since the carriers generated by back lighting in the substrate spread by diffusion, it is necessary from the viewpoint of the spatial resolution that the thicker the substrate becomes, the more MOS capacitor electrodes on the front be spaced apart. This is a restriction that limits the potential resolution of back-illuminated CCDs. This limitation on the element spacing is especially damaging for large-capacity image sensors having a large number of picture elements because it means that a large silicon substrate is needed.

Clearly, front illumination is desirable for simple structures to give good resolution. MOS image sensors, fortunately, have a silicon oxide film layer covering the semiconductor substrate, and this transparent oxide film acts as an optical coating that matches the optical impedance of the silicon to the impedance of air.

Some CCD image sensors also have been built with polysilicon electrodes that can be illuminated from the front, but these polysilicon structures provide poor impedance matches with the oxide film beneath, which causes reflection at the polysilicon-oxide interface. These mismatches create interference patterns in the surface reflection, resulting in a decrease in the photocurrent output.

Whether the image sensor array is illuminated from the front or the back, noise introduced into the video signal by the image sensors and associated circuitry is the greatest factor that limits operation at low light levels. The noise, which masks small photosignals at low light levels, comes mainly from mismatches in parasitic capacitances and thermally generated carriers. Moreover, CCDs suffer noise from transfer losses.

In MOS image sensors, a problem arises from capacitive coupling noise that results from mismatches between parasitic gate-source and gate-drain MOS capacitance of transistors in the scanning circuit and photodiodes and video output port (with which these capacitances are in series). These MOS transistors are analog switches that address the individual photoelements in the array.

When these MOS transistors are turned on or off, there is a corresponding voltage spike on the analog photosignal line being switched. Although these spikes may be reduced by low-pass filtering, because they occur at twice the maximum video frequency, they cannot be eliminated completely.

The perturbation in the magnitude of these spikes throughout the MOS photoarray gives rise to fixed-pattern noise in the video passband. This type of noise can be eliminated by low pass filters. Fortunately, the variation in the noise is small compared to the absolute magnitude of the spikes.

Spike noise, as observed at the sensor output, is referenced to an equivalent noise voltage across the capacitance of the photosensing element, for example, in a representative 512-element line sensor. Values of noise range from $1 \times 10^{-3}$ to $0.5 \times 10^{-2}$ volts, well within practical operating levels. The saturated output signal referred to the photodiode is typically 5 volts or so, resulting in dynamic ranges of 100 to 1 and more.

While CCDs are not affected by the fixed-pattern noise from the spikes in switching transistors, they have fixed-pattern noise resulting from capacitance between clock lines and the output lines. Luckily, these noise pulses are all the same height and can be filtered out by low-pass filters, but the filters consume power and occupy space.

The best method of reducing this capacitive coupling noise is to fabricate video preamplifiers on the same image sensor chips. The noise is thereby reduced because the magnitude of the parasitic coupling capacitance may be made smaller for amplifiers on the same chips than for off-the-chip amplifiers.

Fixed-pattern noise in both MOS image sensors and CCDs can also come from thermal effects (thermally generated carriers). The CCD image sensors, however, are more susceptible to thermal effects than are the MOS image sensors because the surface of the CCDs is not in equilibrium, which causes thermal imbalance.

This form of noise is most troublesome at illumination levels below 10 $\mu W/cm^2$ and for light-integration periods longer than 100 msec for typical image sensors because the noise comprises a significant portion of the dark current at these levels and represents the ultimate operating limitation.

But with the CCD image sensors, transfer-loss noise is more damaging than the fixed-pattern noise. This reduces the exposure range of the CCD image sensors and consequently decreases the contrast that they can detect.

Now, the conventional image sensors will be evaluated from the standpoints of (1) dynamic range, (2) sensitivity, (3) noise and (4) image clarity which are important performance criteria. In ordinary image sensors, the lower limit of the dynamic range depends on the spike noise resulting from the aforesaid capacitive coupling and the thermal noise (dark-current noise), and the upper limit is, in the MOS image sensors, the bias voltage of the photodiodes and, in the CCDs, the depth of the potential well (both of which are about 5 V). In terms of (2), sensitivity, letting the capacitance for storing carriers and the amount of charges being stored be represented by $C_S$ and Q, respectively, the stored voltage is given by $Q/C_S$. This photodiode voltage is capacitively divided by the output line capacitance $C_B$ and output voltage is represented as the following voltage:

$$\frac{C_S}{C_B + C_S} \cdot \frac{Q}{C_S} = \frac{Q}{C_B + C_S}$$

where $C_B$ is the capacitance of the output line. That is, the stored voltage $Q/C_S$ is divided by the sum of the capacitance $C_B$ of the output line and the storage capacitance $C_S$ and the output voltage is reduced to $Q/(C_B+C_S)$. Further, it is a matter of course that the influence of noise must be taken into account when discussing the sensitivity.

Moreover, the sensitivity depends on the amount of light that is sensed by sensor cells, that is, their light collecting ability. The problem of sensitivity should be considered from the view points of unevenness of the illuminated surface and also the impedance matching. The most critical is the spike noise that results from the capacitance coupling and ranges from $10^{-3}$ to $0.5 \times 10^{-2}$ V and defines the lower limits of the dynamic range. The dark-current noise poses a problem as the light integration period becomes longer (for example, in excess of 100 msec) at low light levels below 10 $\mu W/cm^2$ and it limits the operational range of the image sensor.

In terms of (4), spatial resolution, the smaller the cell area, the better. In practice, however, for example, the back illumination type CCD image sensors must be designed so that the electrodes are spaced more than the thickness of the substrate apart. Further, since the voltage $Q/C_S$ stored in the storage capacitance $C_S$ of the image cell is read out in the form of $$\frac{C_S}{C_B + C_S} \cdot \frac{Q}{C_S} = \frac{Q}{C_S + C_B}$$

reduced by the capacitive division with the output line $C_B$, operational amplifiers with high sensitivity and low noise are needed and a minimum area of the image cells is limited, which depends on the sensitivity of the operational amplifiers and the noise level. The light integration period which is determined by a reciprocal of the frame frequency gives temporal resolution (time-wise image clarity).

The CCD image sensors have such a serious drawback that since information is transferred through the cell structure, if even one of the image cells is defective the signal intensity of all image cells preceding the defective one are subject to changes. Accordingly, all the cells must be fabricated defect-free, but such cells are difficult to manufacture with good yield.

In contrast thereto, the MOS image sensor which can be read out by the random access system is free from the above-said defect resulting from the charge transfer. Since the MOS image sensor has the arrangement that charges stored in photodiodes are read out, however, it is diffult to raise the sensitivity, and an amplifier with very low noise and high sensitivity is required.

The present inventors have previously proposed in the aforementioned U.S. patent application Ser. No. 06/130,775 (U.S. Pat. No. 4,377,817) a novel image sensor which has incorporated therein a hook structure having an amplifying function with a view toward removing the aforesaid defects of the prior art CCD and MOS image sensors, in particular, increasing the light detecting sensitivity. This novel image sensor in an improvement over the CCD and MOS image sensors, in its capability for highly sensitive random access of optical information.

The present inventors have further improved the operational characteristics of this novel image sensor and proposed in the aforesaid U.S. patent application an image sensor designed to have an optimum structure for the non-destructive readout operation. This image sensor has each cell comprised of a hook structure, a readout transistor and a refresh transistor but possesses the defects that the cell structure is complex due to the provision of the refresh transistor and hence is difficult to produce and that high packing density is difficult to achieve especially when fabricating a large capacity image sensor.

SUMMARY OF THE INVENTION

Accordingly, it is an object of the present invention to provide a semiconductor image sensor which has simple-structured image sensors, each comprised of the hook structure and the readout transistor, and hence is very suitable for fabrication with high packing density.

Another object of the present invention is to provide a semiconductor image sensor which is of wide dynamic range, high sensitivity, low noise, high image clarity and high packing density property, as compared with the conventional CCD and MOS image sensors, by selecting optimum design conditions based on experimental and analytical results obtained on the image sensor provided with the hook structure.

Another object of the present invention is to provide a semiconductor photosensor in which the impurity concentration in each region of the hook structure, the impurity profile and the thickness of each region are selected so that the light detecting hook operation may be achieved under optimum conditions.

Another object of the present invention is to provide a semiconductor photosensor in which materials used to form each region of the hook structure is selected so that the light detecting hook operation may be achieved under optimum conditions.

Another object of the present invention is to provide a high-sensitivity semiconductor image sensor which has an excellent light collecting ability.

Another object of the present invention is to provide a semiconductor image sensor in which the relationships of electrostatic capacitances in respective parts of the sensor are selected so that a high readout voltage may be stored in the hook structure and read out with high sensitivity.

Yet another object of the present invention is to provide a method of operating a semiconductor image sensor which permits an almost perfect reading-out of the time-integrated value of light incident thereon.

One of the abovesaid objects is achieved by providing a semiconductor image sensor which is provided with a plurality of cells, each comprising a hook structure for radiant energy input information detection use, made up of a conductive first region for receiving radiant energy, a high resistivity second region, a third region of a first conductivity type and having an impurity concentration of $10^{15}$ to $10^{18}$ cm$^{-3}$, a low resistivity fourth region of a second conductivity type reverse from the first conductivity type, and voltage applying means for causing one of photocarriers of each pair generated by the radiant energy in the first and second regions to flow into the third region through the second region, the first to fourth regions being sequentially formed in a semiconductor substrate inwardly thereof from its main surface; a readout transistor using, as one of its main electrodes, the fourth region of the hook structure; and refresh means for flowing excess majority carriers in the third region of the hook structure into the first region through the second region.

Another one of the abovesaid objects is achieved by providing a semiconductor image sensor which has the radiant energy input information detecting hook structure, the readout transistor and the refresh means and in which the fourth region has a larger ground capacitance than the junction capacitance of a pn junction formed between the fourth and third region.

Another one of the above said objects is achieved by providing a method of operating the semiconductor image sensor provided with a radiant energy input information detecting hook structure, the readout transistor and the refresh means, in which the readout transistor is conducted a plurality of times in the light integration period between the conduction of the refresh means for changing the voltage of the first region in the pulsewise manner to flow excess majority carriers in the third region of the hook structure into the first region and the next conduction thereof of the refresh means, whereby permitting readout of the time-integrated value of the input radiant energy.

BRIEF DESCRIPTION OF THE DRAWINGS

In the drawings:

FIG. 1A is a partial sectional view schematically showing the principal part of an embodiment of the semiconductor image sensor of the present invention;

FIG. 1B is a plan view of the image sensor depicted in FIG. 1A;

FIG. 1C shows a schematic circuit diagram of one cell of the image sensor depicted in FIG. 1A;

FIGS. 5A and 5B are a plan view, respectively, and a sectional view illustrating the principal part of another embodiment of the image sensor of the present invention;

DESCRIPTION OF THE PREFERRED EMBODIMENTS

Figure 1D:
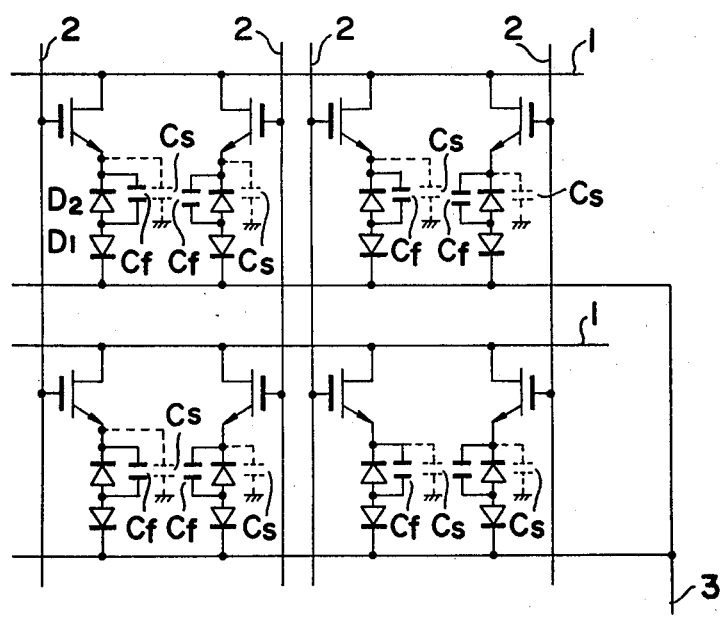
FIG. 1D is a schematic circuit diagram showing the connections of eight cells of the image sensor depicted in FIG. 1A.

With reference to the drawings, the present invention will hereinafter be described in detail.

FIGS. 1A and 1B are respectively a sectional and a plan view showing the cell structure of the image sensor of an embodiment of the present invention, each cell comprising an optical information sensing area utilizing a hook structure and a readout n-channel MISFET (Metal-Insulator-Semiconductor Field Effect transistor) which may also be a MISSIT (Metal-Insulator-Semiconductor Gate Static Induction Transistor) connected to the optical information sensing area. In FIG. 1, reference numeral 1 indicates a signal readout line, which is usually formed of aluminum or doped polysilicon and which is connected to an n+ drain region 9 of the readout transistor $Q_1$ via a doped polysilicon region 10; 11 designates a contact portion between the signal readout line 1 and the doped polysilicon region 10; 2 identifies a readout address line, which is formed of doped polysilicon or a silicide $MoSi_2$, $WSi_2$, $TiSi_2$, $TaSi_2$, $PtSi_2$ or the like of a refractory metal such molybdenum, tungsten, titanium, tantalum, platinum or the like and which serves as a gate electrode of the readout transistor $Q_1$; and 3 denotes a transparent electrode of a substrate which is formed of low resistivity polysilicon, $SnO_2$ or $In_2O_3$, or a thin film of metal disposed so that it may not interfere with the incidence of light on the substrate, the transparent electrode 3 being connected to an n+ region 4 and supplied with a pulse voltage $\phi_S$. For the detection of light, use is not made of a metal electrode which is laid on the entire area of the back of the substrate, but such a metal electrode is preferred for the detecting of an image of an electron beam or ion beam. Reference numeral 5 represents a high resistivity p− layer, which forms a part of a hook structure made up of a floating n+ region 7, a floating p region 6, the i region 5 and the n+ region 4. In an ordinary light detecting state, a positive voltage is applied to the transparent electrode 3 so that the high resistivity region 5 is completely depleted to set up a high-intensity electric field. This is performed by the pulse voltage $\phi_S$. The floating n+ region 7 serves as the source region which is one of the main electrode regions of the readout transistor $Q_1$. During the readout operation the readout address line 2 is opened to turn on the readout transistor $Q_1$ and electrons flow out from the n+ region 9 into the n+ region 7 which has stored therein optical information in the depleted state. Reference numeral 8 shows a channel region of the readout MIS transistor $Q_1$; 19 refers to an isolation regions, which is formed of an oxide film, polyimide or the like; 20 and 26 indicate interlayer insulating films, which are formed by oxide films, nitride films, PSG layers or the like; and 21 designates a gate insulating film of the readout transistor $Q_1$.

FIG. 1A is a sectional view taken on the line A—A' in FIG. 1B. In FIG. 1B, the signal readout lines 1 extend in the horizontal direction along the line A—A' and the address lines 2 extend in the vertical direction, constituting a matrix.

FIG. 1B illustrates only six cells (picture elements). FIG. 1C is a circuit diagram of one cell of the image sensor described above. In FIG. 1C, the hook structure composed of the n+ region 7, the p region 6, the i region 5 and the n+ region 4 is represented by diodes $D_1$ and $D_2$ and the capacitance $C_f$ of the junction formed between the regions 7 and 6. FIG. 1D is a circuit diagram of a matrix of eight image sensor cells using four word lines 2 and two readout lines 1. Since the pulse voltage $\phi_S$, which is provided to a refresh line in FIG. 1C, is applied also to the substrate electrode 3, image information is refreshed in common to all of the image sensor cells.

A description will now be given of the operation of the image sensor shown in FIG. 1A. During the light integration period the pulse voltage $\phi_S$ which is provided to the transparent electrode 3 is a positive constant voltage $V_S(+)$ for refreshing image information, for example, for each light integration period, and during the refreshing operation the pulse voltage $\phi_S$ is 0 volt or a very small negative voltage. In the light integration period the transparent electrode 3 is supplied with the positive voltage $V_S(+)$ and the thickness 1 of the high resistivity layer 5 is selected so that the layer 5 may be substantially or completely depleted throughout by the bias voltage $V_S(+)$. Letting the impurity concentration of the high resistivity layer 5 be represented by N, the positive voltage $V_S(+)$ is selected as follows:

$$V_S \gtrsim \frac{qNl^2}{2\epsilon}, \quad V_S \gtrsim lE_S \quad (1)$$

where $\epsilon$ is the dielectric constant, Es is an electric field in which carriers reach their saturated velocity and q is the unit charge. The condition $V_s \gtrsim lE_s$ is not always required. The positive voltage may be either $V_S > \frac{1}{4}lE_s$ or $V_s > \frac{1}{4}lE_s$; in short, it is sufficient to select the positive voltage so that the carriers may travel at a sufficiently high velocity.

When an optical input is applied to the image sensor in the state in which the positive voltage $V_s(+)$ determined by abovementioned manner is provided to the transparent electrode 3, electrons of electron-hole pairs induced near the n+ region 4 are absorbed by the substrate electrode 3 but holes are accelerated by an electric field and stored in the p region 6. The number of holes per unit area which are stored in the p region is given by $$c \int_0^t S(t)dt$$

in a one-dimensional model, assuming that the quantum efficiency is 1, where t is the light irradiation time, c is the velocity of light and S(t) is the photon density (photons/cm$^3$) of the incident light. It has been known from the results of calculations with a one-dimensional model that a voltage V(t), which is stored in an $n_1$+ region of the hook structure by the $n_1$+pp−$n_2$+ junction structure when the $n_1$+ and p regions form the junction while they are held in the floating state, is not approximately dependent on the capcitance $C_S$ of the $n_1$+ region but is substantially given only by the capacitance $C_f$ of the $n_1$+p junction as follows:

$$V(t) = \frac{Alcq}{C_f} \int_0^t S(t)dt \quad (2, 1)$$

where Al is the area on which the light is incident, t is the light irradiation time, S(t) is the photon density, c is the velocity of the light and q is the unit charge. The condition on the voltage to the $n_2$+ region is substantially satisfied by equation (1).

More precisely, the voltage V(t) is as follows:

$$V(t) = \frac{Alcq}{C_f} \int_0^t S(t)dt - \frac{1}{\beta} \ln\left(1 + \frac{\alpha_2}{\alpha_1}\right) \quad (2, 2)$$

where $$\alpha_1 = \frac{AjqDnN_p}{C_S W_B}\left(1 + \ln\frac{N_{AE}}{N_{AC}}\right), \quad \alpha_2 = \frac{AlScq}{C_f}, \text{ and } \beta = \frac{1}{cT}$$

In the above, Aj and Al are the junction area and the light receiving area of the n+p junction of the floating n+ and p regions, $W_B$ is the width of a neutral region of the p region 6, $N_{AE}$ and $N_{AC}$ are the impurity concentrations of the p region 6 on the side of the n+ region 7 and on the side of the high resistivity layer 5, Dn is the diffusion coefficient of electrons in the p region 6, $N_p$ is the minority carrier density in the p region 6 in a thermal equilibrium state, k is the Boltzmann's constant and T is temperature. These equations hold true when the value of $C_S$ is much larger than $C_f$.

Figure 1E:
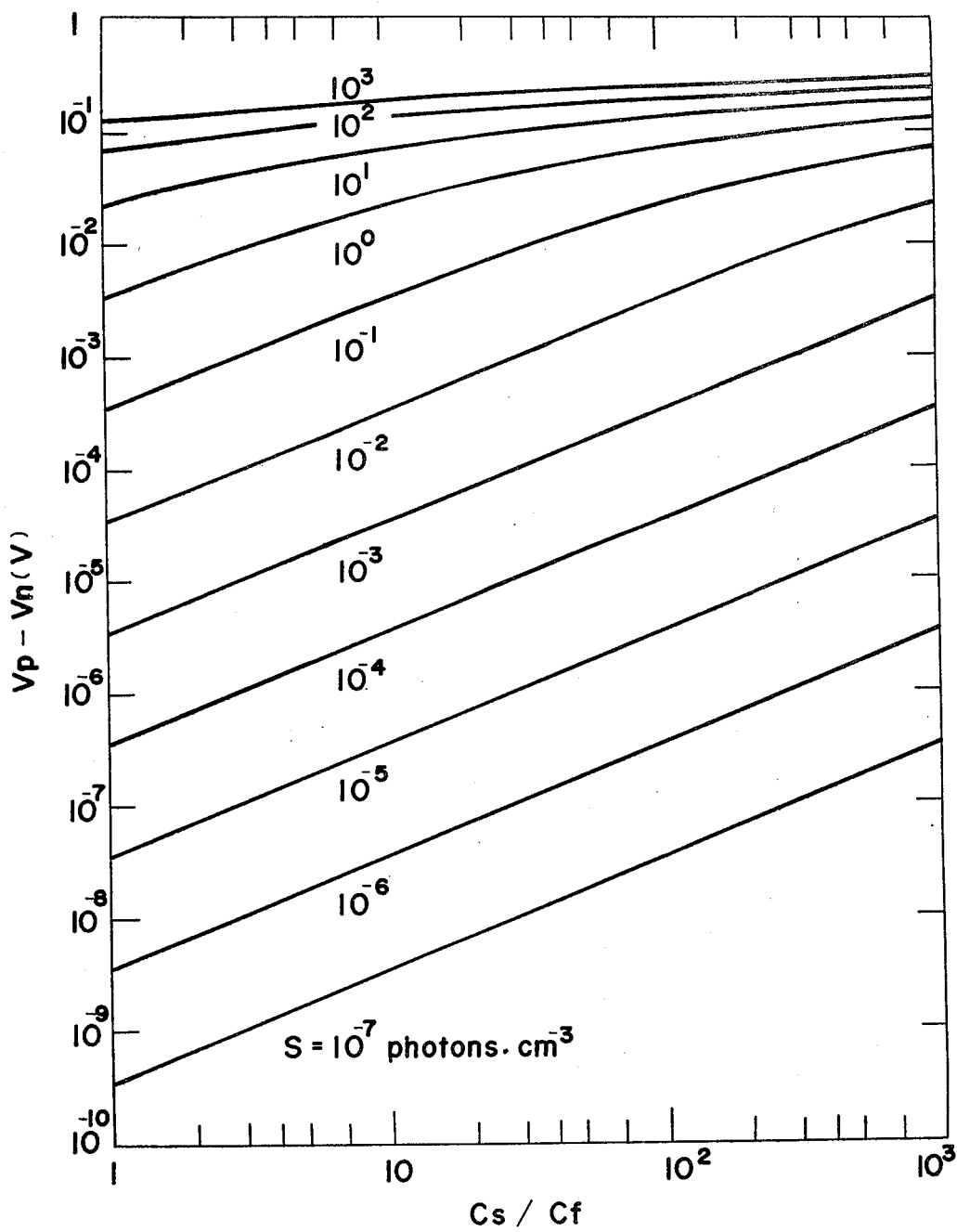
FIGS. 1E and 1F are graphs showing the characteristics of the image sensor of the present invention.

FIG. 1E shows that the value of (Vp−Vn) hardly depends on a wide variation of $C_S/C_f$, where Vp and Vn are the voltage of p region 6 and n+ region 7, respectively. In FIG. 1E, the ordinate represents the difference between the voltage Vp of the p region 6 and the voltage Vn of the n+ region 7 and the abscissa represents $C_S/C_f$. The parameter used is the photon density S of incident light. FIG. 1E shows the results obtained in the case where $Al=Aj=10\times10$ $\mu m^2$, $C_f=0.01$ pF, $\alpha_1=0.3525$ V/sec and $W_B=0.5$ $\mu m$.

Equations (2, 1) and (2, 2) indicate that the voltage stored in the $n_1+$ region is substantially given by the time integrated value of the optical information.

The holes of the electron-hole pairs generated in the high resistivity layer 5 near the n+ layer 4 are stored as excess majority carriers in the p region 6 and, by the stored holes, electrons flow out from the floating n+ region 7, and the voltage V(t) corresponding to the amount of electrons removed from the n+ region 7 is induced therein. In other words, the n+(7)p(6) junction is biased in the forward direction by the amount of the holes stored in the p region 6, that is, by $$Alcq/C_f \int_0^t S(t)dt,$$

and the electrons are drawn out from the n+ region 7, by which the n+ region 7 is depleted and the positive voltage V(t) equivalently given by equations (2, 1) and (2, 2) is stored in the region 7. The positive voltage thus stored in the n+ region 7 is read out via the readout transistor $Q_1$. Upon applying a voltage on the signal address line 2, the readout transistor $Q_1$ is turned on to flow electrons from the n+ region 9 into the n+ region 7. It is sufficient to read out voltage variations which occur on the signal readout line 1 at this time. Since the n+ region 7 and the p region 6 are both held in the floating state, when the positive voltage of the n+ is reduced by the flow therein of the electrons, the n+p junction is gradually biased deep in the forward direction, resulting in the electrons flowing again out from the n+ region 7 toward the substrate across the p region 6. In consequence, the readout transistor $Q_1$ is conducted and the electrons having flowed into the n+ region 7 from the n+ region 9 mostly flow out from the region 7 toward the substrate through the p region 6. That is, excess majority holes stored in the p region 6 due to the optical information are retained even if the readout transistor $Q_1$ is turned on to read out the memory content. This indicates that the readout operation is non-destructive. In the image sensor of the present invention, the voltage D(t) which is read out on the signal readout line 1 is almost independent of the capacitance $C_B$ of the signal readout line 1. Namely, in MOS and CCD image sensors, the voltage $V_S$ of optical information stored in the storage capacitance $C_S$ is usually read out in the form of $$\frac{C_S V_S}{C_S + C_B} = \frac{Q_S}{C_S + C_B}$$

reduced by the capacitive division with the capacitance $C_B$ (usually sufficiently larger than $C_S$) of the signal readout line 1 where $Q_S$ is the amount of charge stored in the storage region. In contrast thereto, in the image sensor of the present invention, since the non-destructive readout operation is performed utilizing the hook structure, even if the readout transistor $Q_1$ operates to read out the memory content, the stored optical information is retained in the light integration period and, as described above, the voltage V(t) is stored as the integrated value of the optical information in the n+ region 7 in the light integration period. Accordingly, a voltage Vout(t) that is read out on the signal readout line 1 is hardly dependent on the capacitance $C_B$ of the signal readout line 1 and it is approximately given by $$Vout(t) = V(t)\left(1 - \exp\left(-\frac{t}{C_B R_B}\right)\right) \quad (3,1)$$

$$= \frac{Alcq}{C_f}\int_0^t S(t)dt \cdot \left(1 - \exp\left(-\frac{t}{C_B R_B}\right)\right) \quad (3,2)$$

where $R_B$ is substantially equal to the on-resistance of the readout transistor $Q_1$. When a resistance exists in the signal readout line 1, it is added, of course.

Figure 1F:
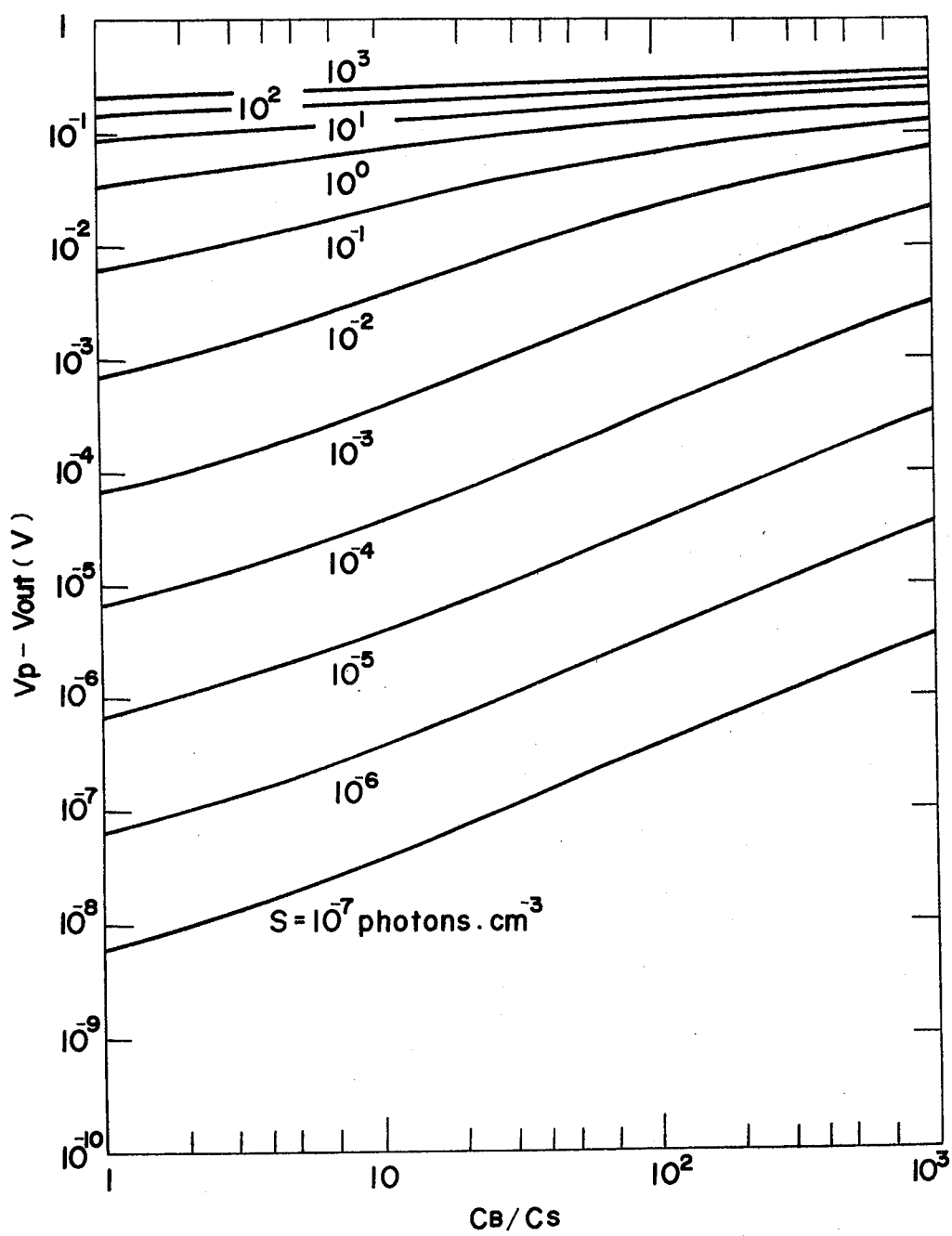

In more concrete terms, the output voltage Vout(t) which is read out on the signal readout line 1 in the steady state is given by $$Vout(t) = \quad (3,3)$$

$$\frac{Alcq}{C_f}\int_0^t S(t)dt - \alpha_2 RC_B - \frac{1}{\beta}\ln\left(1 + \frac{\alpha_2}{\alpha_1}\left(1 - \frac{C_B}{C_S}\right)\right)$$

and the influence of the capacitance $C_B$ is very small. The influence of the capacitance $C_B$ on the output voltage Vout(t) is shown in FIG. 1F, in which the ordinate represents the difference between the voltage Vp of the p region 6 and the output voltage Vout and the abscissa represents $C_B/C_S$. The parameter used is the photon density of incident light. FIG. 1F shows the results obtained in the case where $Al=Aj=10\times10\mu$, $C_f=0.01$ pF, $C_S=0.1$ pF, $\alpha_1=0.3525$ V/sec and $W_B=0.5$ $\mu m$.

The readout operation of the image sensor of the present invention is just like an operation of reading out the internal power source V(t) charged in the capacitance $C_B$ by turning on the transistor $Q_1$. It is seen that the output voltage is not read by conventional capacitive division. It is also evident that the readout rate is determined by selecting the time constant $C_B R_B$ to be small in equations (3, 1) to (3, 3).

In the embodiment of FIG. 1A, a major storage capacitor $C_S$ that is larger than $C_f$, and a ground line are not shown for the sake of brevity, but it should be understood that the major storage capacitor $C_S$ and the ground line exist in a detailed sectional structure (see IEEE Transactions on Electron Devices, Vol. ED-26, No. 12, p 1975, FIG. 11).

As will be appreciated from the circuit diagram of FIG. 1C, the applied voltage $V_S(+)$ is divided by each of the diodes $D_1$ and $D_2$ and the storage capacitance $C_S$ of the n+ region 7. Considering the transient state immediately after the application of the voltage $V_S(+)$, the diode $D_1$ is approximated by an electrostatic capacitance $C_i$ which is in reverse proportion to the thickness 1 of the high resistivity region 5. Accordingly, in order to achieve the optimum condition for applying most of the voltage $V_S(+)$ to the high resistivity region 5, it is desirable that the thickness l of the high resistivity region 5 be selected so that $C_i << C_f, C_S$.

Figure 2:
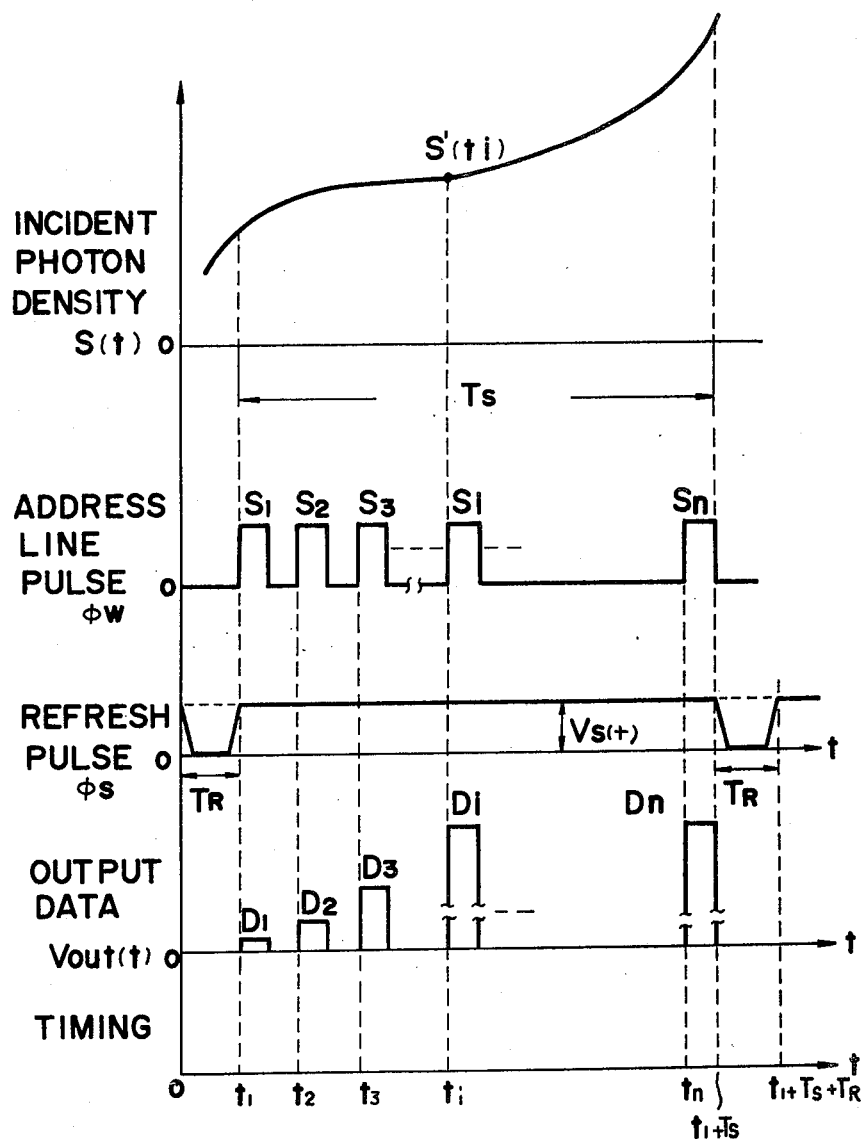
FIG. 2 is a waveform diagram showing an example of the operation of the image sensor of the present invention.

FIG. 2 shows waveforms at respective parts, explanatory of an example of the operation based on the operational principle of the image sensor of the present invention. When the optical input S(t) arbitrarily varies with time, the pulse voltage $\phi_S$ that is provided to the substrate electrode, applies a fixed bias $V_S$ during the light integration period and, in the refresh period, it is given OV or a negative voltage. FIG. 2 shows the operation of reading out the optical input of an arbitrary photon density S(t) using a readout address line pulse $\phi_W$ and a refresh pulse $\phi_S$. In the time intervals between moments 0 and $t_1$ and between $(t_1+T_S)$ and $(t_1+T_S+T_R)$, the potential of the refresh pulse $\phi_S$ is held at OV or a little negative to perform an operation by which holes stored as excess majority carriers in the floating p region 6 are drawn out therefrom into the n+ region 4. In the time interval from $t_1$ to $(t_1+T_S)$, the potential of the refresh pulse $\phi_S$ is $V_S(t)$ and the substrate electrode 3 is biased positively. FIG. 2 shows an example in which the readout operation was conducted a plurality of times in this light integration period (from $t_1$ to $t_1+T_S$). The address line pulse $\phi_W$ on the readout address line 2 is provided as a plurality of readout pulses $S_1, S_2, \ldots S_n$ in one light integration period $T_S$ and, for each pulse, the readout transistor $Q_1$ is conducted, by which the voltage V(t) of the optical information stored in the floating n+ region 7 is read out on the signal readout line 1, as indicated by OUTPUT DATA Vout(t).

Data outputs $D_1, D_2, \ldots D_n$ read out on the signal readout line 1 are approximately given by $$Vout(ti) = \frac{A I_{cq}}{C_f} \int_0^{ti} S(t)dt \quad (4)$$

since the image sensor of the present invention adopts the non-destructive readout and since a voltage substantially equal to the voltage V(t) of the floating n+ region 7 is read out on the signal readout line 1. Differentiating equation (4) once in respect of time, it is possible to obtain optical information pulse-amplitude-modulated by a sampling period $t_s$ (which is equal to the repetitive period of the address line pulse $\phi_w$). It is a matter of course that the sampling pulse period $t_s$ is selected sufficiently longer than the response time of the optical information sensing part of this image sensor which is dependent on the frequency characteristics of the readout transistor $Q_1$ and the hook structure constituted by the n+(7)p(6)i(5)n2+(4) junction structure.

With the image sensor illustrated in FIG. 1A, it is possible to refresh the excess majority carriers stored in floating p region by changing the voltage of the substrate electrode 3 using the pulse voltage $\phi_S$. The refresh operation is accomplished by reducing, pulsewise, the substrate voltage to OV or a slightly negative voltage to draw out the excess holes from the p region 6 toward the substrate.

In the image sensor of the present invention, the light integration period and the refresh period are distinguished from each other by changing the substrate voltage in a pulsewise manner. The cell of this image sensor is simple in construction as compared with the cell structure of the prior art. Accordingly, the image sensor of the present invention can be formed with high packing density and is easy to manufacture. The cell portion is made up of only the hook structure and the readout transistor $Q_1$. In addition, since the hook structure region and the readout transistor portion are formed to lie one on the other, the area of each picture element can be reduced to be very small, providing very excellent spatial image clarity as compared with that of the conventional image sensor. The image sensor of the present invention illustrated in FIG. 1 is the back illuminated type and substantially the entire area of the back of the image sensor corresponding to all the region serves as an optical information sensing area. It is apparent that the image sensor of the present invention is far more excellent in the utilization efficiency of the irradiated light, that is, in the optical information receiving information than the prior art CCD and MOS type image sensors. Needless to say, the efficiency can further be raised through utilization of a transparent, non-reflecting coating film which is good in impedance matching for light.

In the image sensor of the present invention it is as referred to previously that the voltage occurring on the bit line increases as the cell area decreases, that is, as the junction capacitance $C_f$ decreases equivalently, and the sensitivity of the readout voltage of this image sensor roughly becomes $(C_S+C_S)/C_f$ times higher than that obtainable with the conventional MOS and CCD type image sensors. This capacitance ratio can readily be made 100 times or more. This means that the image sensor of the present invention is not susceptible to voltage spike noise or fixed pattern noise that comes from the analog switch during the readout as mentioned previously with regard to the prior art. Especially, the sensitivity to the optical input the intensity of which is lower than 10 $\mu W/cm^2$ can be raised more than 100 times. In the prior art image sensors, as the cell area decreases, the storage capacitance $C_S$ also decreases substantially in proportion to the cell area but the voltage which is read out on the signal readout line is reduced by the capacitive division of the stored voltage $Q_S/C_S$ as follows:

$$\frac{Q_S}{C_S} \cdot \frac{C_S}{C_S+C_B} = \frac{Q_S}{C_S+C_B}$$

As described previously, the spike noise or the fixed pattern noise accompanying the analog switch constitutes one factor that provides operational limits at low light levels in the prior art. In contrast thereto, in the image sensor of the present invention the sensitivity to an optical input of very low intensity is also enhanced corresponding to the readout voltage sensitivity improved $(C_S+C_B)/C_f$ times that obtainable with the conventional image sensors. Further, the spatial image clarity in the case of very low-intensity optical input is also raised by the reduction of the size of the cell structure.

In the image sensor of the present invention, measures are also taken for the dark current noise which is another factor defining the limit of the dynamic range at low light levels. The present invention employs such a structure and impurity concentrations that the occurrence of a dark current in the sensor proper is decreased at least one order of magnitude, as compared to the conventional MOS and CCD image sensors. In FIG. 1A, the region by which light is sensed is the high resistivity region 5 and the dark current of this light sensing region depends on the electrons in the p region 6 and the holes in the n+ region 4 if there hardly exists in the high resistivity region 5 deep impurity levels which excite carriers. Letting the acceptor impurity concentration of the p region 6 and the donor impurity concentration of the n+ region 4 be represented by $N_A$ and $N_D$, respectively, and assuming that the impurities are mostly ionized, the minority carriers in the respective regions are given by $$n_{p0} = \frac{n_i^2}{N_A} \tag{5}$$

$$p_{n0} = \frac{n_i^2}{N_D} \tag{6}$$

wherein $n_i$ is the density of carriers which are thermally excited in an intrinsic semiconductor. By selecting the carrier density $n_i$ to be $1.6 \times 10^{10}$ cm$^{-3}$ at room temperature and the acceptor and donor impurity $N_D$ to be about $10^{20}$ cm$^{-3}$, the number of the minority carriers $p_{n0}$ can be suppressed to about three to four.

A saturated current of a pin+ diode in the reverse-biased condition is approximately given by $$J_S = \left( \frac{qD_p p_{n0}}{L_p} + \frac{qD_n n_{p0}}{L_n} \right) \cdot \left\{ \exp\left( -\frac{qV}{KT} \right) - 1 \right\} \tag{7}$$

in the absence of generation-recombination current in the high resistivity region. Equation (7) is applicable to the case where the diffusion lengths $L_p$ and $L_n$ of holes and electrons are smaller than the thicknesses $W_n$ and $W_p$ of the n+ and p regions 4 and 6, respectively. If the thicknesses $W_n$ and $W_p$ become smaller than the diffusion lengths $L_p$ and $L_n$, $L_p$ and $L_n$ in equation (7) are respectively replaced with $W_n$ and $W_p$. In equation (7), $D_p$ and $D_n$ are the diffusion constants of holes in the n+ region 4 and electrons in the p region 6. When the voltage V in equation (7) becomes large to some extent, equation (7) can be rewritten as follows:

$$J_S = \frac{qD_p p_{n0}}{L_p} + \frac{qD_n n_{p0}}{L_n} \tag{8, 1}$$

or $$J_S = \frac{qD_p p_{n0}}{W_n} + \frac{qD_n n_{p0}}{W_p} \tag{8, 2}$$

As is apparent from equations (8,1) and (8,2), if $P_{n0}$ and $n_{p0}$ are small, the dark current $J_S$ becomes small. In general, the impurity concentration of a semiconductor substrate for use in the CCD or MOSFET is approximately $10^{15}$ to $10^{16}$ cm$^{-3}$. Accordingly, either one of $n_{p0}$ takes a relatively large value. In the present invention, the n+ region 4 and the p region 6 can easily be fabricated with impurity concentrations of about $10^{19}$ to $10^{21}$ and about $10^{15}$ to $10^{17}$ cm$^{-3}$, respectively. Accordingly, the dark current in the optical information sensing area in the present invention can be reduced at least one order of magnitude. With a small dark current, the light integration period can be increased by that and the detection range for low-intensity optical inputs is widened. At the present-day technical level, it is a generation-recombination current in the high resistivity region that determines the dark current. Therefore, it is important to reduce this generation-recombination current, and it is required to improve the quality of the high resistivity region, that is, to extend the lifetime of carriers.

Figure 3:
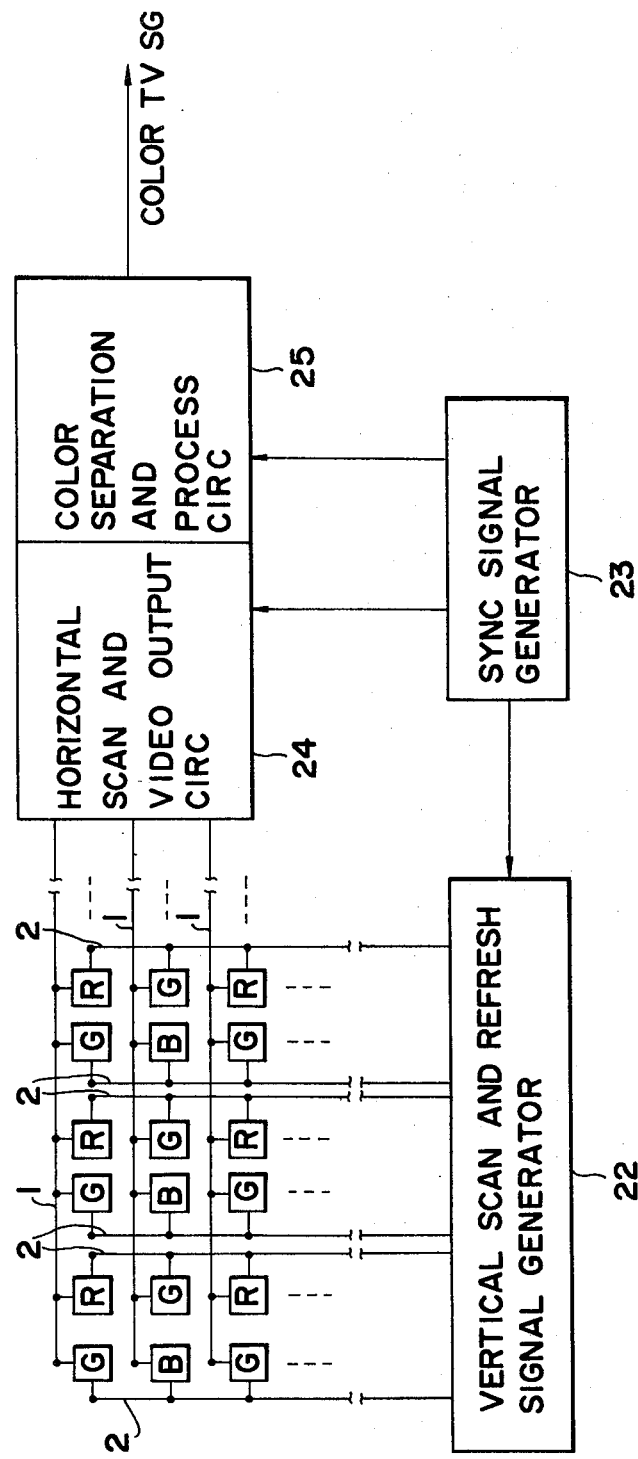
FIG. 3 is a block diagram illustrating an example of an image sensor system in which cells of the image sensor shown in FIG. 1A are assembled into an area color image sensor.

FIG. 3 illustrates an example of the image sensor of FIG. 1 as applied to an image sensor system for color TV. Color filters are arranged in a checkered pattern on an optical input receiving surface corresponding to the cells. In FIG. 3, reference numeral 22 indicates a vertical scan and refresh signal generator; 24 designates a horizontal scan and video output circuit; and 25 identifies a color separation and process circuit. The circuits 22, 24 and 25 are controlled by synchronizing signals from a synchronous signal generator 23. In the embodiment of FIG. 3, all picture elements are refreshed by the pulse voltage $\phi_S$ which is applied to the substrate electrode 3. It is easy to select both the horizontal scanning frequency and vertical scanning frequency bands to be those employed in the existing NTSC, PAL (Phase Alternation by Line) or SECAM system. The refresh frequency is nearly equal to the TV frame frequency and the entire picture is refreshed at the same time.

Figure 4:
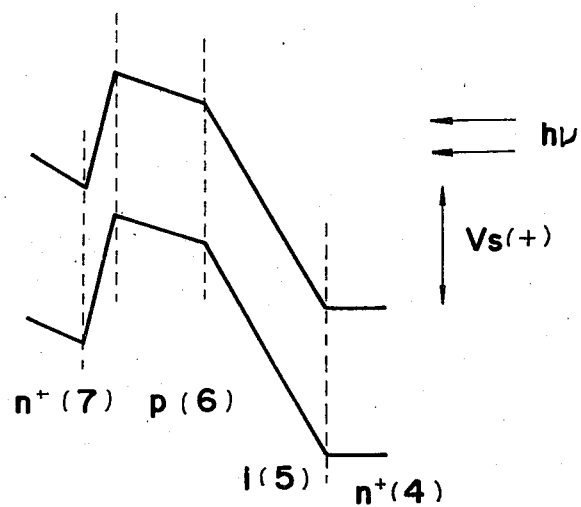
FIG. 4 shows an example of the potential profile of the hook structure constituting the cell of the image sensor shown in FIG. 1A.

In the embodiment of FIG. 1A, in order that electrons may be effectively injected from the n+ region 7 into the p region 6 and the high resistivity region 5 and that holes stored in the p region 6, which are excess majority carriers, may be prevented from flowing into the n+ region 7, it is possible to employ the method of raising the emitter injection efficiency in a bipolar transistor. This is a structural improvement for increasing the performances of the image sensor of the present invention, in particular, with regard to its linearity. When optically excited holes accumulate in the p region 6 to charge it positively, electrons are injected into the p region 6 from the floating n+ region 7 adjacent thereto and flow out from the p region 6 into the high resistivity region, thereafter being absorbed by the electrode 3 on the optical input receiving surface of the device. In this case, the excess majority holes stored in the p region 6 also tend to flow into the adjoining n+ region 7. If the holes should flow into the n+ region 7, then there would the linearity of photo detection would be lost and n+ region would not be charged to a voltage proportional to the integrated value of the amount of incident light. One solution to this defect is to form the floating n+ region 7 by a wide band gap material. Another solution is to facilitate flowing out of the electrons from the n+ region 7 but to prevent the holes of the p region from flowing into the n+ region 7. This can be accomplished by grading the impurity distributions in the n+ region 7 and the p region 6. In the p region 6, the impurity distribution is made so that the impurity concentration gradually decreases as the distance from the junction between the p region 6 and the n+ region 7 increases, whereas in the n+ region 7, the impurity distribution is made so that the impurity concentration rises as the distance from the junction between the n+ region 7 and the p region 6 increases. With such an arrangement, the electrons injected into the p region 6 flow into the high resistivity region 5, accelerated by a drift electric field, but the holes in the n+ region 7 are forced back by a decelerating electric field. The intensity E of an electric field which occurs, for example, when the impurity concentrations are distributed exponentially is given by $$E = \frac{kT}{q} \cdot \frac{1}{W} \ln \frac{N_2}{N_1} \tag{9}$$

where k is the Boltzmann's constant, T absolute temperature, $N_2$ the impurity concentration in the n+p junction plane, and $N_1$ the impurity concentration at a place spaced a distance W apart from the n+p junction plane. In the case where $N_2/N_1=100$, if $W=0.5$ μm, then $E=2.4\times 10^3$ V/cm at room temperature and if $W=1$ μm, then $E=1.2\times 10^3$ V/cm. For example, in the n+ region 7, the impurity concentration is selected to be about $1\times 10^{19}$ cm$^{-3}$ in the junction plane and is increased up to $1\times 10^{21}$ cm$^{-3}$ or so as the distance from the junction plane increases, and in the p region 6, the impurity concentration is selected to be approximately $1\times 10^{17}$ cm$^{-3}$ in the junction plane and is decreased to about $1\times 10^{15}$ cm$^{-3}$ as the distance from the junction plane increases. The ratio $N_2/N_1$ need not always be limited specifically to 100 but may also be larger or smaller than that. In short, it is sufficient to facilitate flowing out of the electrons from the n+ region 7 but to prevent flowing out of the holes from the p region 6. To perform this, it is also effective to select the impurity concentration of the n+ region 7 to be sufficiently higher than the impurity concentration of the p region 6. FIG. 4 schematically shows a one-dimensional band structure of the n+(7)p(6)i(5)n+(4) hook structure in the case where the n+ region 7, the p region 6 and the n+ region 4 are regarded as the emitter, base and collector of a a bipolar transistor, respectively, and a collector bias $V_S(+)$ is applied. When the impurity concentration of the n+ region 7 is sufficiently high and a depletion layer appears only on the side of the p region 6, the width Wbe of the depletion layer between the n+ and p regions is given by $$Wbe = \left\{ \frac{2\epsilon}{qN_{Ae}} (V_{bi} - V_{be}) \right\}^{\frac{1}{2}} \quad (10)$$

where $\epsilon$ is the dielectric constant, $N_{Ae}$ the impurity concentration at one side of the p region, $V_{bi}$ a diffusion potential and $V_{be}$ is a forward bias voltage applied to the n+p junction.

Table 1 shows the $N_{Ae}$ and $V_{be}$ dependence of the depletion layer width Wbe.

TABLE 1

| $N_{Ae}$ | $V_{be}$ | | | |
|---|---|---|---|---|
| | 0V | 0.1V | 0.2V | 0.3V |
| $3\times 10^{17}$ cm$^{-3}$ | 660Å | 625Å | 590Å | 550Å |
| $1\times 10^{17}$ | 0.113 μm | 0.107 μm | 0.10 μm | 935Å |
| $3\times 10^{16}$ | 0.203 μm | 0.192 | 0.180 | 0.167 μm |
| $1\times 10^{16}$ | 0.346 | 0.326 | 0.305 | 0.283 |
| $3\times 10^{15}$ | 0.620 | 0.584 | 0.545 | 0.503 |
| $1\times 10^{15}$ | 1.055 | 0.990 | 0.922 | 0.848 |
| $3\times 10^{14}$ | 1.890 | 1.770 | 1.65 | 1.51 |

In order to increase the light detecting sensitivity, it is desirable to minimize the junction capacitance $C_f$, as described previously. That is, it is desirable to minimize the impurity concentration of that portion of the floating p region (hereinafter referred to as an excess majority carrier storage region) adjoining the floating n+ region (hereinafter referred to as a majority-carrier-lacking-amount storage region). For example, when the impurity concentration of the excess majority carrier storage region is selected to be $1\times 10^{17}$ cm$^{-3}$, the thickness of the depletion layer is about 1100 Å and the capacitance $C_f$ of the junction having an area of $10\times 10$ μm$^2$ is $8.9\times 10^{-15}$F. Letting a minimum detection voltage of the readout portion be represented by Vmin, a minimum amount of charge Qmin stored in the excess majority carrier storage region is given substantially by $C_f$Vmin. For example, if the minimum detection voltage Vmin is 1 mV, then $Q$min$=8.9\times 10^{-18}$ (Q) in the case of $C_f=8.9\times 10^{-15}$F. That, when the excess majority carrier storage region accumulates 56 electrons, it can be detected. It seems that the lower the impurity concentration of the excess majority carrier storage region is, the more the junction capacitance $C_f$ is reduced and the more the detecting sensitivity can be increased. With too low an impurity concentration, however, a signal is masked by noise which comes from thermally excited carriers. Letting the impurity concentration of the excess majority carrier storage region in the junction plane be represented by $N_A$, the density $n_{po}$ of the thermally excited electrons is given by $n_i^2/N_A$. Since the thickness W of the majority carrier storage region is usually smaller than the diffusion length of electrons, the current density J by the thermally excited electrons is as follows:

$$J = qD_n \frac{n_{po}}{W} = qD_n \frac{n_i^2}{WN_A} \quad (11)$$

where $D_n$ is the diffusion coefficient of electrons. If $W=0.5$ μm and if $N_A=1\times 10^{17}$ cm$^{-3}$, then $J=2\times 10^{-10}$ A/cm$^2$. If the area of the excess majority carrier storage region is $4\times 4$ μm$^2$, a current i becomes $3.2\times 10^{-17}$ A. The quantity of charges that are stored by this thermal current is, for example, $Q=i\Delta t=4.8\times 10^{-19}$ (Coulomb) in 15 msec. This is three in number. Since the number of noise carriers which are thermally excited is three and since 1 mV is detected when 55 carriers are lacking, as described previously, the impurity concentration of the excess majority carrier storage region may be selected to be about $1\times 10^{17}$ cm$^{-3}$. Of course, the detection is possible with a little lower impurity concentration. Accordingly, for enhancement of the detecting sensitivity, it is preferred that the impurity concentration of the excess majority carrier storage region can be selected to be relatively low. This prevents the holes stored in this region from flowing out therefrom into the majority-carrier-lacking-amount storage region, providing for improved linearity.

FIGS. 5A and 5B illustrate another embodiment of the image sensor of the present invention in which each cell is comprised of the hook structure and the readout transistor $Q_1$. FIG. 5A is a plan view of the cell array of the image sensor and FIG. 5B a sectional view taken on the line A—A' in FIG. 5A. A description now be given of the construction of this embodiment.

The hook structure is formed by an n+(64)p(63)p−(62)n+(61) junction structure, and the readout transistor $Q_1$ is constituted by a MOSSIT (which may also be a MOSFET, of course) which has its source, channel and drain formed by an n+ region 64, p region 65 and n+ region 66, respectively.

Reference numeral 75 indicates a signal readout line, which is connected to the n+ region 66. The signal readout line 75 is formed of doped polysilicon or silicide of tungsten, molybdenum, tantalum, titanium, platinum or the like, and aluminum. Reference numeral 78 designates a signal address line, which is formed of doped polysilicon or silicide of tungsten, molybdenum, tantalum or the like and which is connected via a contact hole 79 to a gate region 72 of the readout transistor $Q_1$;

and 60 identifies a transparent electrode which is formed of low resistivity polysilicon or a material such as $In_2O_3$ or $SnO_2$ and connected to an n+ region 61. A pulse voltage $\phi_S$ is applied, for the refresh operation and for the photo detection biasing operation, to the region 60, as is the case with the embodiment of FIG. 1A. Reference numeral 62 denotes a high resistivity p− layer (which may also be an i or n− layer) which is designed to have such a thickness l that substantially satisfies equation (1) by the substrate bias voltage $V_S(+)$ which is applied to the substrate region 60 in the light integration period. The impurity concentration of a p region 63 in which holes generated by the optical input are stored as excess majority carriers is selected to be about $10^{15}$ to $10^{17}$ cm$^{-3}$. The impurity concentration of an n+ region 64, in which optical information is stored as the voltage V(t) given by equations (2, 1) and (2, 2) when electrons are injected by the operation of the hook structure into the high resistivity p− layer 62 to make it an electron depletion quantity storage region, is selected to be about $10^{19}$ to $10^{21}$ cm$^{-3}$. An impurity concentration gradient is set in each of the n+ region 64 and the p region 63 so that the holes stored in the p region 63 may not flow out therefrom into the n+ region 64 and that electrons may readily flow out therefrom. It is also possible, of course, to form the n+ region 64 of a material having a wide energy gap. For example, if the n+ region 64 is formed by the SIPOS (Semi-Insulating Polycrystalline Silicon) technique, a band gap of about 1.5 eV or so is obtained, by which it is possible to prevent the holes from flowing into the region 64 from the p region 63. Also in this embodiment, the major storage capacitor $C_S$ larger than $C_f$ and the earth line are omitted for the sake of brevity but it should be understood that the major storage capacitor $C_S$ always exists.

In the embodiment shown in FIG. 5B, an insulating layer 67 is interposed between the p region 63 and the p channel region 65 and the n+ drain region 66. This layer 67 is formed by injecting $O_2$ or $N_2$ ions into silicon using the SIMOX (Separation by Implanted Oxygen) technique or the like. This embodiment employs, as the readout transitor $Q_1$, a MOSSIT having the word line formed by p+ polysilicon and the effective channel length can be made less than 1 μm, for example, 0.1 μm or so. Accordingly, the size of the image cell (picture element) can be made very small, so that the spatial image clarity is very excellent. Reference numerals 68 and 69 identify insulating regions for isolation use; and 73 and 75 denote inter-layer insulating layers e.g. of an oxide. A region 71 serves as a gate insulating film of the readout transitor $Q_1$. In the embodiment of FIG. 5B, when a mask alignment error is L/2 as shown in FIG. 5A, the cell area is 6L×2.5L. The signal address line 78 and a hole 79 of a p+ polysilicon region 72 are common to two cells.

The operation of the embodiment depicted in FIGS. 5A and 5B is exactly the same as the operation of of the image sensor shown in FIGS. 1A and 1B. By the pulse voltage $\phi_S$, the substrate region 60 or 61 is supplied with the voltage $V_S(+)$ in the light integration period. In the refresh period the voltage $\phi_S$ become 0 V or lightly negative, performing the operation of drawing out the holes which are excess majority carries stored as optical information in the p region 63. As will be seen from this embodiment, the refresh operation takes place over the entire image sensor array at a time. Accordingly, if the refresh frequency is selected to be substantially equal to the TV frame frequency, then it is possible to transmit image information at the TV band frequency. It is also possible to produce such an image sensor system for color TV as shown in FIG. 3, with color filters arranged in a checkered pattern on the light receiving surface.

Figure 5C:
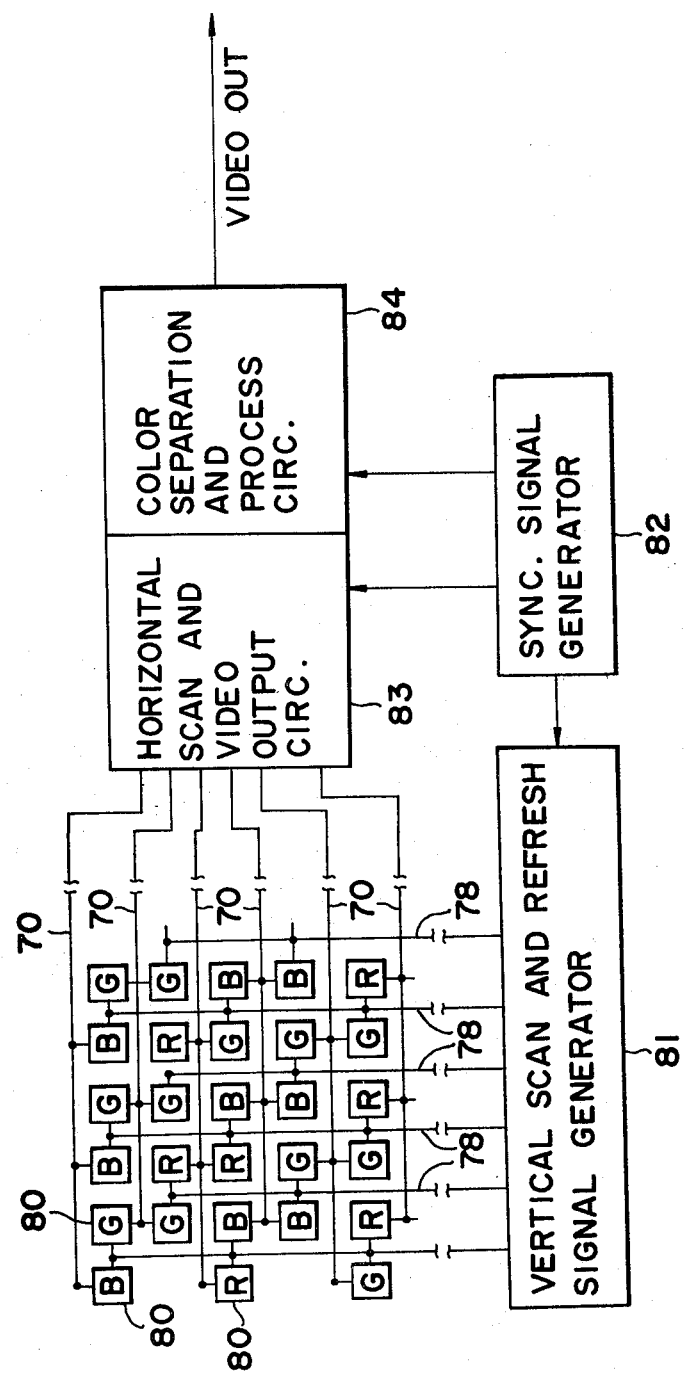
FIG. 5C is a block diagram illustrating an example of a circuit of an area color image sensor system into which the cells of the image sensor shown in FIGS. 5A and 5B are assembled.

FIG. 5C illustrates an example of the image sensor system in which the image sensor cells depicted in FIGS. 5A and 5B are incorporated into a matrix for a color image sensor. The embodiment of FIGS. 5A and 5B is arranged so that two cells are selected by one contact hole and an area image sensor having the image sensor cells arranged in a matrix form is arranged as shown in FIG. 5C (each square indicated by 80 being one picture element). In FIG. 5C, three kinds of color filters of blue, green and red are arranged in a checkered pattern on the light receiving surface. By conducting the refresh operation using the substrate bias pulse $\phi_S$ substantially at the frame frequency, the image sensor system of this example can sufficiently be operated in the frequency band of the NTSC, PAL or SECAM color TV signal. In FIG. 5C, reference numeral 83 indicates a horizontal scan and video output circuit; and 84 designates a color separation and process circuit.

The embodiment of FIGS. 5A and 5B has been described to be formed of silicon but it can also be made of other materials. Namely, the readout transistor can be constituted, for example, by forming the n+ region 61, the high resistivity region 62 and the p layer 63 of $Hg_xCd_{1-x}Te$ capable of detecting infrared rays, forming an insulating layer of ZnS on the p layer 63 at a predetermined position, growing thereon polysilicon by the CVD technique, leaving the polysilicon at a predetermined position and adding a desired impurity by ion implantation. By selecting x in the $Hg_xCd_{1-x}Te$ to be about 0.2, infrared rays of wavelengths in the vicinity of 10 μm can be detected with high sensitivity. Polysilicon can be made into a relatively good single crystal through the use of the laser anneal technique. Since the band gap of silicon is larger than that of the $Hg_xCd_{1-x}Te$, holes hardly flow out from the p type excess majority carrier storage region 63 into the n+ type majority-carrier-lacking-amount storage region 64; namely, good linearity can be obtained.

Figure 6A:
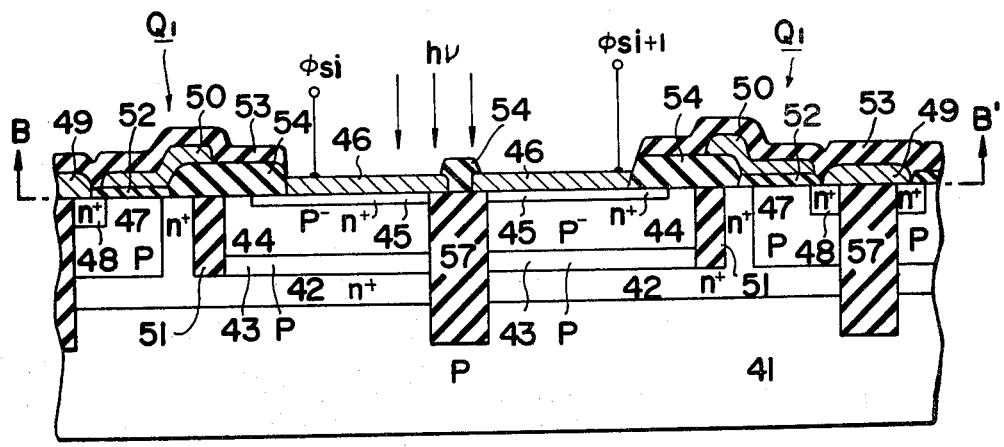
FIGS. 6A and 6B are a partial sectional view and a plan view respectively schematically showing a front illuminated type image sensor in accordance with an embodiment of the present invention.
Figure 6B:
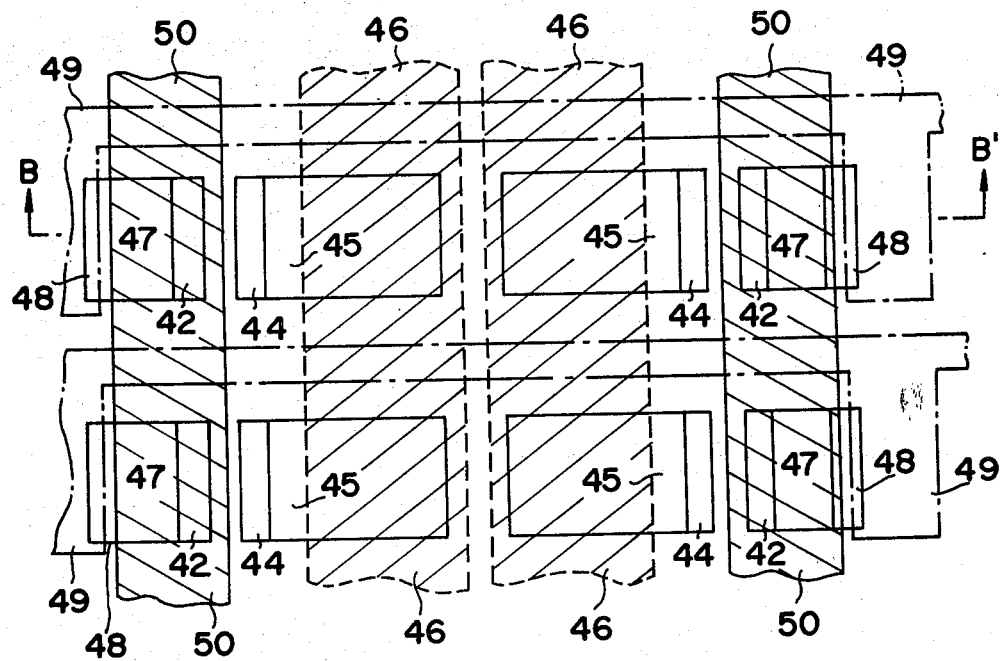

FIGS. 6A and 6B illustrates an example of a front illuminated type image sensor of the present invention. FIG. 6A is a sectional view taken on the line B—B in FIG. 6B which is a plan view of the embodiment. An n+ region 42 and a p region 43 on a p type substrate 41 are formed as floating regions and an n+(42)p(43)p−(44)n+(45) junction structure constitutes a hook structure. A transparent electrode 46 connected to an n+ region 45 is supplied with a pulse voltage $\phi_S$. The pulse voltage $\phi_S$ is one that is $V_S(+)$ in the light integration period and 0 V or slightly negative in the refresh period, as is the case with each of the embodiments described previously.

The n+ region 42 serves as a source region of a readout MOS transistor $Q_1$. The channel of the readout transistor $Q_1$ is a p region 47 and its drain is an n+ region 48, which is connected to a signal readout line 49. The thickness of a p− region 44 is selected in relation to the value $V_S(+)$ of the bias pulse voltage $\phi_S$ in a manner to satisfy equation (1), as described previously with regard to FIG. 1A. In the case of detecting ordinary visible light, the thickness of the p− region 44 is selected to range from about 2 to 4 μm. Reference numerals 51, 57 and 54 indicate isolation and insulating regions formed of an oxide, polyimide or the like.

A region 52 is a gate insulating layer of the readout MOS transistor $Q_1$ and a region 53 is an inter-layer insulating film as of an oxide, CVD oxide film or the like. A region 50 is a gate electrode of the readout transistor $Q_1$ which is formed of doped polysilicon or silicide and which serves as an address line at the same time.

The impurity concentrations of the n+ region 42 and the p region 43 are set to about $10^{19}$ to $10^{21}$ and $10^{15}$ to $10^{17}$ cm$^{-3}$, respectively, and the impurity concentration of the n+ region 45 is set to about $10^{19}$ to $10^{21}$ cm$^{-3}$. From the standpoint of reducing the dark current noise, it is preferred that the impurity concentrations of the n+ region 45 and the p region 43 be as high as possible and that the impurity concentration of the p− region 44 be as low as possible, as referred to previously. The region 44 may be an n− or i layer and it is a high resistivity layer.

Figure 6C:
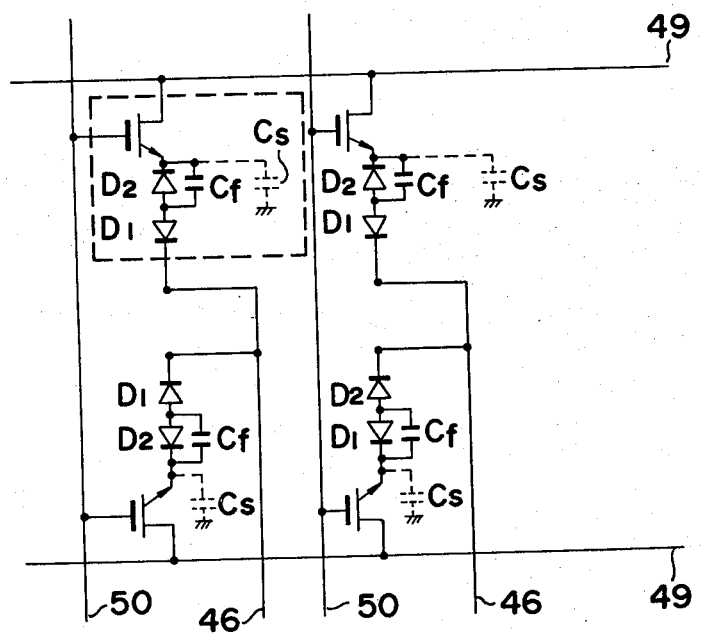
FIG. 6C is a circuit diagram showing the connections of four cells of the image sensor depicted in FIGS. 6A and 6B.

FIG. 6C shows a circuit diagram of four cells on a matrix. The refresh line 46 by the transparent electrode line extends in parallel to each signal address line 50. In the embodiment of FIG. 6, an electrostatic capacitance $C_S$ of the n+ region 42 is omitted for the sake of brevity but it should be understood that a capacitance $C_S$ which is larger than the electrostatic capacitance $C_f$ of the n+(42)p(43) junction, exists in practice.

Figure 7:
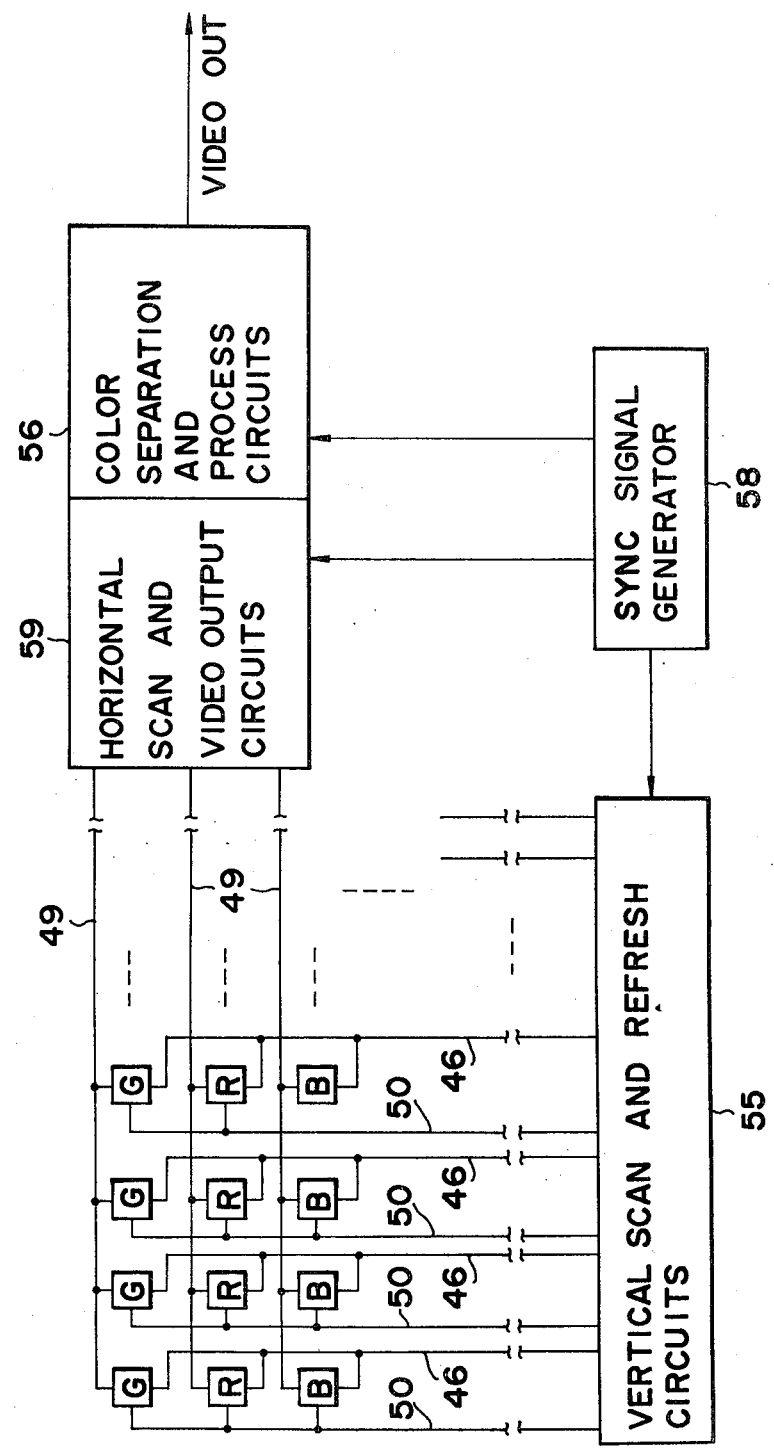
FIG. 7 is a block diagram illustrating an example of a circuit of an area color image sensor system into which the cells of the image sensor shown in FIG. 6A are assembled.

FIG. 7 illustrates an example of the front illuminated type image sensor of FIG. 6 as being applied to a color image sensor system. Color filters of green, red and blue are each arranged on the transparent electrode of each cell. In FIG. 7, reference numeral 55 indicates a vertical scan and refresh signal generator; 59 designates a horizontal scan and video output circuit; and 56 identifies a color separation and process circuit. These circuits 55, 59 and 56 are synchronized with signals from a synchronous signal generator 58. In the example of FIG. 7, the cells are arranged so that the same color may be detected from the same signal readout line 49. It is also possible to use a vertical scanning frequency as a field frequency of the TV system and to perform interlaced scanning by devising an address signal on each address line 50 and, at the same time, conduct the refresh operation at the filed frequency. Refresh lines 46 extend in parallel with the address lines 50, so that the refresh operation can also be achieved for each line. That is, in the color image sensor system of FIG. 7, it is possible to detect color picture information in a frequency band adjusted to each of the NTSC, PAL and SECAM systems and transmit the detected information as a color TV signal. Also in this example, all picture elements can simultaneously be refreshed as in the embodiments of FIGS. 3 and 5C.

It is a matter of course that the present invention is not limited specifically to the embodiments described in the foregoing. Needless to say, the conductivity types of the respective regions mentioned in the foregoing embodiments may be reversed. In the case of increasing the photo detecting sensitivity to short-wavelength lights such as blue and the like, it is preferred that the thin, high impurity concentration region formed under the transparent electrode on the light receiving surface be removed; in this case, it is sufficient to form a Schottky junction between the transparent diode and the high resistivity region. At any rate, it is sufficient to provide a structure capable of non-destructive and high-sensitivity detection by forming the excess majority carrier storage region and the majority-carrier-lacking-amount storage region in adjacent relation so that they are contiguous to the high resistivity light detecting region. The readout transistor need not always be limited specifically to the MOSFET or MOSSIT but may be a junction FET or SIT, or a transistor of the Schottky type gate. While in the foregoing the combination of $Hg_xCd_{1-x}Te$ and silicon is described, use can also be made of combinations of other materials.

The semiconductor image sensor of the present invention can easily be fabricated through the use of the conventionally known crystal growth, diffusion, ion implantation, CVD and lithography techniques. Since the cell structure is simplified, the image sensor of the present invention can be formed with a very high packing density and hence it is very excellent in image clarity. As described in the foregoing, the image sensor of the present invention is applicable to the detection of a color or monochrome video signal, that is, to movie cameras and, by making positive use of the feature of the non-destructive readout, it can be very effectively used for the detection of a color or monochrome still picture, that is, for still cameras. Accordingly, the image sensor of the present invention has a wide application.

It will be apparent that many modifications and variations may be effected by those skilled in the art without departing from the spirits and scope of the present invention described in the foregoing. Accordingly, the appended claims are recited to cover such modifications and variations, too.

What is claimed is:

1. A semiconductor image sensor provided with a plurality of cells, each comprising a radiant energy input information detecting hook structure composed of a conductive first region for receiving a radiant energy, a high resistivity second region, a third region of a first conductivity type and having an impurity concentration in the range of $10^{15}$ to $10^{18}$ cm$^{-3}$, a low resistivity fourth region of a second conductivity type reverse from the first conductivity type, at least one electrode which is transparent to the radiant energy formed on said first region, and voltage applying means for directing one of photo carriers generated in pairs by the radiant energy in the first and second regions to the third region through the second region by applying to said transparent electrode a positive voltage with respect to said third region during a radiant energy period only, the first to fourth regions being sequentially formed on a semiconductor substrate from a main surface thereof toward the inside thereof;

a readout transistor using the fourth region of the hook structure as one of its main electrodes; and refresh means for extinguishing excess majority carriers stored non-destructively in the third region of the hook structure;

the refresh means being voltage applying means for flowing out the excess majority carriers stored non-destructively in the third region into the first region through the second region by applying to said transparent electrode one of a negative and zero voltage with respect to said third region during a refresh period.

2. A semiconductor image sensor according to claim 1 wherein the third region has an impurity concentration distribution which is graded so that the impurity concentration decreases as the distance from the interface with the fourth region increases.

3. A semiconductor image sensor according to claim 1 wherein the fourth region has an impurity concentration distribution which is graded so that the impurity concentration increases as the distance from the interface with the third region increases.

4. A semiconductor image sensor according to claim 1 wherein the fourth region is formed of a semiconductor material having a larger energy gap than a semiconductor material for the third region.

5. A semiconductor image sensor according to claim 1 wherein the transparent electrode is formed of a semiconductor material having a larger energy gap than that of a semiconductor material for the second region.

6. A semiconductor image sensor according to claim 1 wherein the first region is a metal electrode disposed so that it does not substantially intercept the input radiant energy.

7. A semiconductor image sensor according to claim 1 wherein the first region is composed of electrode means and a low resistivity semiconductor region of the second conductivity type formed between the electrode means and the second region.

8. A semiconductor image sensor according to claim 1 wherein the readout transistor and the hook structure are respectively formed on the sides of first and second main surfaces of the semiconductor substrate.

9. A semiconductor image sensor according to claim 1 wherein a control electrode and the other main electrode of the readout transistor are respectively connected to the readout address line and a signal output line.

10. A semiconductor image sensor provided with a plurality of cells, each comprising a radiant energy input information detecting hook structure composed of a conductive first region for receiving a radiant energy, a high resistivity second region, a third region of a first conductivity type and having an impurity concentration in the range of $10^{15}$ to $10^{18}$ cm$^{-3}$, a low resistivity fourth region of a second conductivity type reverse from the first conductivity type, the fourth region having an impurity concentration more than 100 times higher than the third region, at least one electrode which is transparent to the radiant energy formed on said first region, and voltage applying means for directing one of the photo carriers generated in pairs by the radiant energy in the first and second regions to the third region through the second region by applying to said transparent electrode a positive voltage with respect to said third region during a radiant energy period only, the first to fourth regions being sequentially formed on a semiconductor substrate from a main surface thereof toward the inside thereof;

a readout transistor using the fourth region of the hook structure as one of its main electrodes; and refresh means for extinguishing excess majority carriers stored non-destructively in the third region of the hook structure;

the refresh means being voltage applying means for flowing out the excess majority carriers stored non-destructively in the third region into the first region through the second region by applying to said transparent electrode one of a negative and zero voltage with respect to said third region during a refresh period.

11. A semiconductor image sensor provided with a plurality of cells, each comprising a radiant energy input information detecting hook structure composed of a conductive first region for receiving a radiant energy, a high resistivity second region, a third region of a first conductivity type and having an impurity concentration in the range of $10^{15}$ to $10^{18}$ cm$^{-3}$, a low resistivity fourth region of a second conductivity type reverse from the first conductivity type, at least one electrode which is transparent to the radiant energy formed on said first region, and voltage applying means for directing one of photo carriers generated in pairs by the radiant energy in the first and second regions to the third region through the second region by applying to said transparent electrode a positive voltage with respect to said third region during a radiant energy period only, the first to fourth regions being sequentially formed on a semiconductor substrate from a main surface thereof toward the inside thereof, the fourth region having a ground electrostatic capacitance larger than the junction capacitance of a pn junction formed between the fourth and third regions;

a readout transistor using the fourth region of the hook structure as one of its main electrodes; and refresh means for extinguishing excess majority carriers stored non-destructively in the third region of the hook structure;

the refresh means being voltage applying means for flowing out the excess majority carriers stored non-destructively in the third region into the first region through the second region by applying to said transparent electrode one of a negative and zero voltage with respect to said third region during a refresh period.

12. A semconductor image sensor provided with a plurality of cells, each comprising a radiant energy input information detecting hook structure composed of a conductive first region for receiving a radiant energy, a high resistivity second region, a third region of a first conductivity type and having an impurity concentration in the range of $10^{15}$ to $10^{18}$ cm$^{-3}$, the third region having a thickness in the range of about 0.1 to 3 $\mu$m, a low resistivity fourth region of a second conductivity type reverse from the first conductivity type, at least one electrode which is transparent to the radiant energy formed on said first region, and voltage applying means for directing one of the photo carriers generated in pairs by the radiant energy in the first and second regions to the third region through the second region by applying to said transparent electrode a positive voltage with respect to said third region during a radiant energy period only, the first to fourth regions being sequentially formed on a semiconductor substrate from a main surface thereof toward the inside thereof;

a readout transistor using the fourth region of the hook structure as one of its main electrodes; and a refresh means for extinguishing excess majority carriers stored non-destructively in the third region of the hook structure;

the refresh means being voltage applying means for flowing out the excess majority carriers stored non-destructively in the third region into the first region through the second region by applying to said transparent electrode one of a negative and zero voltage with respect to said third region during a refresh period.

13. A semiconductor image sensor according to claim 12, wherein the third region has an impurity concentration distribution which is graded so that the impurity concentration decreases as the distance from the interface with the fourth region increases.

14. A semiconductor image sensor according to claim 12, wherein the fourth region has an impurity concentration distribution which is graded so that the impurity concentration increases as the distance from the interface with the third region increases.

15. A semiconductor image sensor according to claim 12, wherein the fourth region is formed of a semiconductor material having a larger energy gap than a semiconductor material for the third region.

16. A semiconductor image sensor according to claim 12, wherein the first region is a metal electrode disposed so that it does not substantially intercept the input radiant energy.

17. A semiconductor image sensor according to claim 12, wherein the first region is composed of electrode means and a low resistivity semiconductor region of the second conductivity type formed between the electrode means and the second region.

18. A semiconductor image sensor according to claim 12, wherein the readout transistor and the hook structure are respectively formed on the sides of first and second main surfaces of the semiconductor substrate.

19. A semiconductor image sensor according to claim 12, wherein a control electrode and the other main electrode of the readout transistor are respectively connected to the readout address line and a signal output line.

20. A method of operating a semiconductor image sensor which is provided with a plurality of cells, each comprising a radiant energy input information detecting hook structure composed of a conductive first region for receiving a radiant energy, a high resistivity second region, a third region of a first conductivity type and having an impurity concentration in the range of $10^{15}$ to $10^{18}$ cm$^{-3}$, a low resistivity fourth region of a second conductivity type reverse from the first conductivity type, at least one electrode which is transparent to the radiant energy formed on said first region, and voltage applying means for directing one of photo carriers generated in pairs by the radiant energy in the first and second regions to the third region through the second region by applying to said electrode a positive voltage with respect to said third region during a radiant energy period only, the first to fourth regions being sequentially formed on a semiconductor substrate from a main surface thereof toward the inside thereof;

a readout transistor using the fourth region of the hook structure as one of its main electrodes; and refresh means for flowing out excess majority carriers stored non-destructively in the third region of the hook structure into the first region through the second region;

wherein the readout transistor is conducted at least once or more in a time interval between an activation of the refresh means and a next activation thereof, whereby the time integrated value of the input radiant energy is read out.

* * * * *